(12) United States Patent
Nishizuka

(10) Patent No.: US 8,298,955 B2
(45) Date of Patent: Oct. 30, 2012

(54) PLASMA ETCHING METHOD

(75) Inventor: Tetsuya Nishizuka, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 756 days.

(21) Appl. No.: 12/224,979

(22) PCT Filed: Mar. 13, 2007

(86) PCT No.: PCT/JP2007/054965
§ 371 (c)(1),
(2), (4) Date: Sep. 11, 2008

(87) PCT Pub. No.: WO2007/105727
PCT Pub. Date: Sep. 20, 2007

(65) Prior Publication Data
US 2009/0023296 A1    Jan. 22, 2009

(30) Foreign Application Priority Data

Mar. 13, 2006  (JP) .................. 2006-067735

(51) Int. Cl.
*H01L 21/302* (2006.01)
*H01L 21/461* (2006.01)

(52) U.S. Cl. ........ 438/706; 438/707; 438/710; 438/719; 438/720

(58) Field of Classification Search .......... None
See application file for complete search history.

(56) References Cited

U.S. PATENT DOCUMENTS

| | | | |
|---|---|---|---|
| 5,498,768 A * | 3/1996 | Nishitani et al. | 438/644 |
| 5,670,421 A * | 9/1997 | Nishitani et al. | 438/641 |
| 7,166,538 B2 * | 1/2007 | Doshita | 438/723 |
| 2002/0037648 A1 | 3/2002 | Nishizawa | |
| 2003/0052086 A1 | 3/2003 | Mizumura et al. | |
| 2003/0235987 A1 * | 12/2003 | Doshita | 438/689 |
| 2005/0188922 A1 | 9/2005 | Ishibashi et al. | |
| 2005/0227470 A1 | 10/2005 | Kofuji | |

FOREIGN PATENT DOCUMENTS

| | | |
|---|---|---|
| JP | 2005-275376 | 10/1993 |
| JP | 2000-235970 | 8/2000 |
| JP | 2004-039935 | 2/2004 |
| JP | 2005-277397 | 10/2005 |

(Continued)

OTHER PUBLICATIONS

Tetsuya Nishizuka et al., Oyo Butsurigaku Kankei Rengo Koen Yokoshu, The Japan Soceity of Applied Physics, Mar. 29, 2005, vol. 52, No. 1, p. 612.

(Continued)

*Primary Examiner* — Duy Deo
(74) *Attorney, Agent, or Firm* — Smith, Cambrell & Russell, LLP

(57) ABSTRACT

This invention relates to a method for conducting an etching process which uses a plasma of a process gas. This etching process is conducted on a wafer W including a substrate 101, an underlying film 102, 103 formed on the substrate, and a film 104 to be etched that is formed on the underlying film. A main etching gas formed up of a chlorine-containing gas and an oxygen-containing gas, and a nitrogen-containing gas are used as the process gas. In this etching method, etching is conducted under a condition that an $N_2^+/N_2$ intensity ratio of $N_2^+$ to $N_2$, derived from emission spectra of the plasma, is at least 0.6.

5 Claims, 8 Drawing Sheets

FOREIGN PATENT DOCUMENTS

| | | |
|---|---|---|
| JP | 2005-302840 | 10/2005 |
| KR | 2002-0025717 | 4/2002 |
| KR | 2003-0025779 | 3/2003 |
| KR | 2005-0089995 | 9/2005 |
| WO | 2004/059689 | 7/2004 |

OTHER PUBLICATIONS

PCT Notification of Transmittal of Translation of the International Preliminary Examination Report (Form PCT/IB/338) dated Jan. 2004.

PCT International Preliminary Report on Patentability (Form PCT/IB/373) dated Jan. 2004.

PCT Written Opinion of the International Searching Authority (Form/ISA/237) dated Apr. 2005.

Notification of Reason for Rejection issued on Oct. 31, 2008 for Korean Application No. 2007-7028057.

Japanese Office Action issued on Sep. 27, 2011 for corresponding Japanese Application No. 2006-067735.

* cited by examiner

PLASMA ETCHING METHOD

TECHNICAL FIELD

The present invention relates to a method for etching a semiconductor wafer or the like to be processed, by using a plasma of a process gas including a nitrogenous gas, and to an apparatus using the same method.

BACKGROUND ART

During the manufacture of a semiconductor device, various processes such as film deposition, surface modification, oxidation/diffusion, and etching, are conducted upon the semiconductor wafer that is a substrate to undergo processing. The etching process most commonly uses plasma etching in which the wafer is etched with a resist film of a desired pattern as a mask by using a plasma to obtain higher processing accuracy.

In recent years, a tungsten-containing film such as a tungsten (W) film, tungsten silicide (WSi) film, or tungsten nitride (WN) film, has been most commonly used to form the gate electrode of a MOS-type semiconductor. For the formation of such a gate electrode, a semiconductor wafer is first prepared that has a structure in which a gate oxide film, a polysilicon film, and a tungsten-containing film are formed sequentially over a silicon substrate first and then a patterned etching mask is formed on the tungsten-containing film. Next, the tungsten-containing film on the semiconductor wafer is etched to form the gate electrode.

The etching of the tungsten-containing film has traditionally used a chlorine-based gas such as $Cl_2$, HCl, or $SiCl_4$, or a fluorine-based gas such as $CF_4$ or $SF_6$. For enhanced selectivity with respect to an under-layer, $O_2$ has also been added to these gases in some cases, as described in, for example, Japanese Laid-Open Patent Application Publications JP-A-2004-39935 and JP-A-2000-235970.

An etched-surface geometry/morphology and selectivity with respect to the under-layer become important factors in forming the gate electrode by etching the tungsten-containing film. An even better etched-surface geometry/morphology and an even higher selectivity with respect to the under-layer are being called for with the growing demands for the further microstructuring and higher-density mounting of semiconductor devices in recent years.

However, chlorine-based gases are low in reactivity, and it is therefore inconvenient to use such a gas, since the temperature of the semiconductor wafer must be correspondingly increased to obtain an appropriate etched-surface geometry/morphology (vertical profile geometry/morphology). In contrast, the use of a fluorine-based gas provides an excellent geometry, but results in the insufficiency of an etching selectivity with respect to the under-layer. For these reasons, it is difficult with conventional technology to simultaneously obtain the appropriate etched-surface geometry/morphology and high selectivity with respect to the under-layer.

DISCLOSURE OF THE INVENTION

The present invention was made considering the above, and an object of the invention is to realize etching of a desired film, particularly of a tungsten-containing film formed on a silicon-containing film, while ensuring an appropriate geometry and a high selectivity with respect to an under-layer, without increasing a temperature of the film to be etched.

In order to solve the foregoing problem, the present invention provides, as a first aspect thereof, an etching method using a plasma of a process gas to carry out an etching process for an object including a substrate, an underlying film formed on the substrate, and a film to be etched that is formed on the underlying film, wherein: a main etching gas and a nitrogen-containing gas are used as the process gas to etch the film under a condition that an $N_2^+/N_2$ intensity ratio of $N_2^+$ to $N_2$, derived from emission spectra of the plasma, is at least 0.6.

The present invention also provides, as an aspect similar to the above, an etching method using a plasma of a process gas to carry out an etching process for an object including a substrate, an underlying film made of a silicon-containing film formed on the substrate, and a film to be etched that is made of a tungsten-containing film formed on the underlying film, wherein: a chlorine-containing gas, an oxygen-containing gas, and a nitrogen-containing gas are used as the process gas to etch the film under a condition that an $N_2^+/N_2$ intensity ratio of $N_2^+$ to $N_2$, derived from emission spectra of the plasma, is at least 0.6.

The above etching process can use a $Cl_2$ gas as the chlorine-containing gas, an $O_2$ gas as the oxygen-containing gas, and an $N_2$ gas as the nitrogen-containing gas.

In addition, the etching process can use a polysilicon film as the silicon-containing film, and either a tungsten film or a stacked structure of a tungsten nitride film and a tungsten film, as the tungsten-containing film.

Furthermore, the plasma can be generated by using microwaves. In this case, the plasma is preferably a substance generated by using microwaves radiated from a planar antenna, and suitable types of planar antennas include a radial line slot antenna (RLSA).

In addition, it is preferable that the process gas supplied into a processing vessel is activated to be changed into a plasma by using microwaves radiated from a radial line slot antenna at an electric power of at least 2000 W, and that a ratio of a flow rate of the $N_2$ gas to that of the $Cl_2$ gas should be at least 2000% in the process gas supplied into the processing vessel.

The present invention provides, as a second aspect thereof, an etching apparatus using a plasma of a process gas to carry out an etching process for an object including a substrate, an underlying film formed on the substrate, and a film to be etched that is formed on the underlying film, the apparatus comprising: a processing vessel configured to accommodate the object; a gas supply system configured to supply a main etching gas and a nitrogen-containing gas as the process gas into the processing vessel while controlling respective flow rates of the gases; a plasma generating system configured to generate the plasma in the processing vessel; an emission spectrum detection system configured to detect emission spectra of the plasma of the process gas generated in the processing vessel; and a controller configured to control the gas supply system and the plasma generating system to obtain plasma-generating conditions under which an $N_2^+/N_2$ intensity ratio of $N_2^+$ to $N_2$, derived from the emission spectra of the plasma detected by the detection system, is at least 0.6.

In addition, the present invention provides, as an aspect similar to the above, an etching apparatus using a plasma of a process gas to carry out an etching process for an object including a substrate, an underlying film made of a silicon-containing film formed on the substrate, and a film to be etched that is made of a tungsten-containing film formed on the underlying film, the apparatus comprising: a processing vessel configured to accommodate the object; a gas supply system configured to supply a chlorine-containing gas, an oxygen-containing gas, and a nitrogen-containing gas as the process gas into the processing vessel while controlling respective flow rates of the gases; a plasma generating system configured to generate the plasma in the processing vessel; an emission spectrum detection system configured to detect emission spectra of the plasma of the process gas generated in the processing vessel; and a controller configured to control the gas supply system and the plasma generating system to obtain plasma-generating conditions under which an $N_2^+/N_2$ intensity ratio of $N_2^+$ to $N_2$, derived from the emission spectra of the plasma detected by the detection system, is at least 0.6.

The emission spectrum detection system can include a monochromator configured to disperse plasma light into spectrum form, and a measuring instrument configured to measure intensities of spectrum lights obtained.

Also, the plasma generating system can include a microwave generator configured to supply microwaves into the processing vessel. Alternatively or additionally, the plasma generating system can include a planar antenna configured to radiate the microwaves generated by the microwave generator, to introduce the radiated microwaves into the processing vessel. Suitable types of planar antennas include a radial line slot antenna (RLSA).

The present invention provides, as a third aspect thereof, a computer-readable storage medium storing a control program configured to control an etching apparatus and executing the above etching method.

According to the present invention, when etching is conducted under a condition that an $N_2^+/N_2$ intensity ratio of $N_2^+$ to $N_2$, derived from emission spectra of a plasma, is at least 0.6, nitriding/reducing actions of nitrogen ions represented by $N_2^+$ will be effectively developed and the oxidation of a reaction product will be suppressed. Thus, the appropriate etched-surface geometry/morphology and high selectivity can be simultaneously achieved, even at low temperature.

In particular, during etching of an object on which a tungsten-containing film that is a film to be etched is formed on a silicon-containing layer provided as an underlying film, when a chlorine-containing gas, an oxygen-containing gas, and a nitrogen-containing gas are used as a process gas to etch the object under the conditions that offer an $N_2^+/N_2$ intensity ratio of at least 0.6, the nitriding/reducing actions of the nitrogen ions represented by $N_2^+$ will be effectively developed and the deterioration of an etched-surface geometry/morphology due to the deposition of $WO_3$ or other reaction products low in volatility will be prevented. Thus, the appropriate etched-surface geometry/morphology and high selectivity can be simultaneously achieved without increasing a temperature of the object.

BEST MODE FOR CARRYING OUT THE INVENTION

Hereunder, embodiments of the present invention will be described referring to the accompanying drawings.

Figure 1:
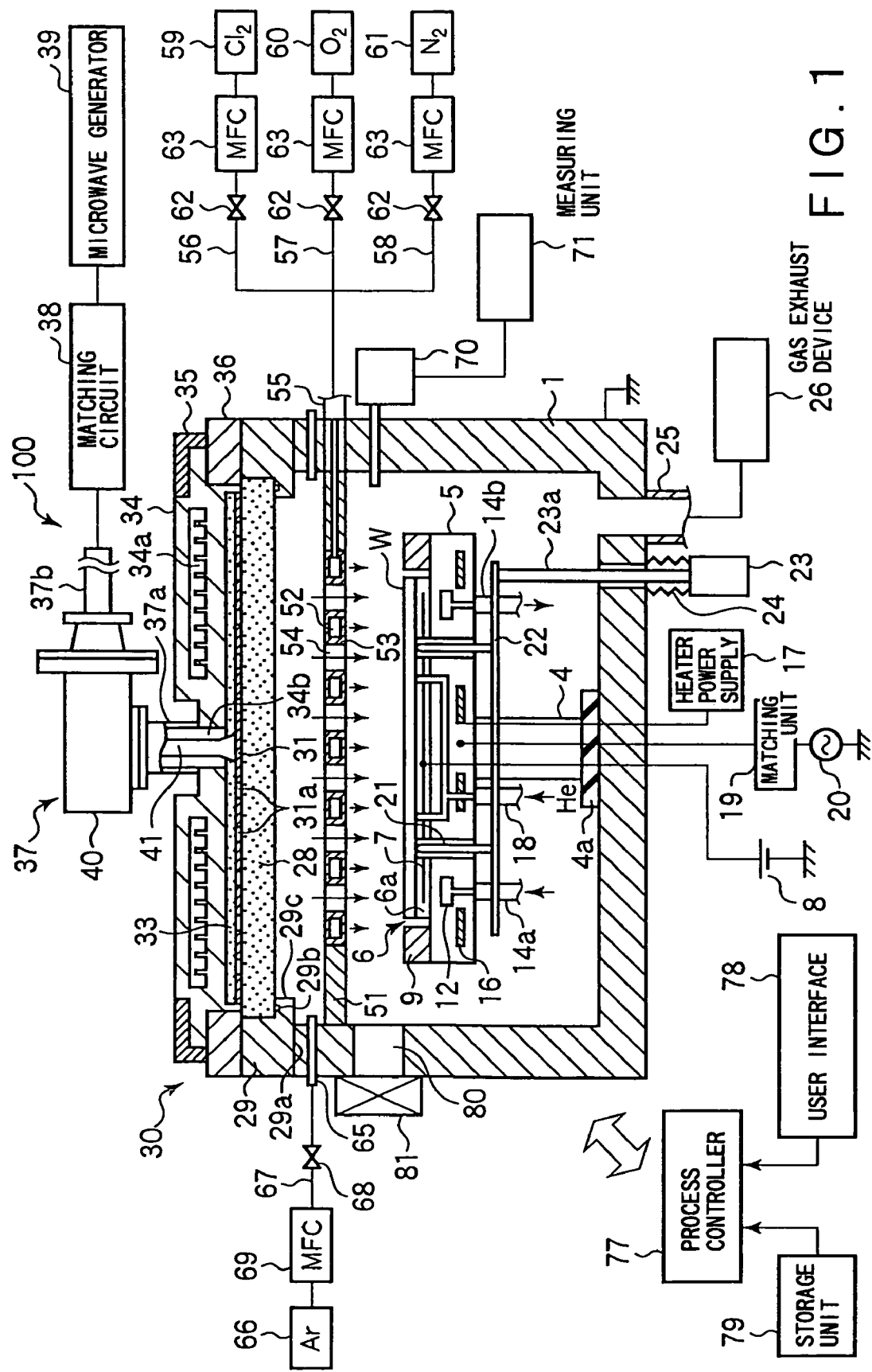
FIG. 1 is a cross-sectional view of a plasma-etching apparatus for implementing a plasma-etching method according to a first embodiment of the present invention.

FIG. 1 is a cross-sectional view of a plasma-etching apparatus for implementing a plasma-etching method according to a first embodiment of the present invention. The plasma-etching apparatus 100 is constructed as an RLSA microwave plasma-etching apparatus that introduces microwaves from a radial line slot antenna (RLSA) into a processing vessel and generates a plasma.

The plasma-etching apparatus 100 has the electrically grounded and essentially cylindrical processing vessel 1 made of an airtightly constructed metallic material such as aluminum or stainless steel, and a semiconductor wafer that is an object to undergo processing is etched in a processing space defined by the processing vessel 1. A microwave introduction unit 30 for introducing microwaves into the processing space is provided at an upper section of the processing vessel 1.

Inside the processing vessel 1, a susceptor 5 supported by a tubular supporting member 4 erected centrally in a bottom section of the processing vessel 1 via an insulating member 4a is provided to support the wafer W horizontally. The susceptor 5 and the supporting member 4 are constituted by, for example, a material having an alumite-treated (anodically oxidized) surface, such as aluminum.

An upper face of the susceptor 5 includes an electrostatic chuck 6 that uses electrostatic force to attract and retain the semiconductor wafer W. The electrostatic chuck 6 has a structure with an electroconductive film formed as an electrode 7 in an insulator 6a, and a direct-current (DC) power supply 8 is electrically connected to the electrode 7. The electrostatic force, such as Coulomb's force, that has been developed by a DC voltage from the DC power supply 8, causes the electrostatic chuck 6 to attract and retain the semiconductor wafer W. An electroconductive focus ring (correction ring) 9 formed of silicon, for example, is disposed on the upper face of the susceptor 5, around the electrostatic chuck 6 (semiconductor wafer W), to improve uniformity of etching.

A refrigerant chamber 12 is provided, for example, in circumferential form inside the susceptor 5. A refrigerant of a desired temperature is supplied in circulating form from an externally provided chiller unit not shown, via pipes 14a and 14b, to the refrigerant chamber 12. A processing temperature for the semiconductor wafer W on the susceptor can thus be controlled. The susceptor 5 also has a heater 16 buried therein for temperature control. The heater 16 has a connected power supply 17, from which the heater 16 is electrically powered to generate heat. Also, a heat-transfer gas, for example, a helium (He) gas, from a heat-transfer gas supply system not shown is supplied between the upper face of the electrostatic chuck 6 and a reverse side of the semiconductor wafer W via a gas supply line 18.

The susceptor 5 further has a high-frequency bias power supply 20 connected thereto via a matching unit 19. Supply of high-frequency power from the high-frequency bias power supply 20 to the susceptor 5 draws in ions towards the semiconductor wafer W. The high-frequency bias power supply 20 outputs high-frequency power of any frequency ranging from, for example, 300 kHz to 13.56 MHz.

A plurality of wafer support pins 21 for supporting and lifting the wafer W are provided inside the susceptor 5 so as to be extendable and retractable with respect to the surface of the susceptor 5. The wafer support pins 21 are each fixed to a support plate 22. The wafer support pin 21 is moved vertically via a lifting rod 23a and the support plate 22 by a driving mechanism 23 provided below the processing vessel 1, such as an air cylinder. A section of the lifting rod 23a that projects outward from the processing vessel 1 is surrounded with a bellows 24.

The processing vessel 1 has a gas exhaust pipe 25 connected to the bottom thereof, and a gas exhaust device 26 including a high-speed vacuum pump is connected to the exhaust pipe 25. Operating the exhaust device 26 evacuates the processing vessel 1, thus allowing an internal pressure of the processing vessel 1 to be reduced to a desired degree of vacuum rapidly. In addition, a loading/unloading port 80 for loading and unloading the wafer W, and a gate valve 81 for opening and closing the loading/unloading port 80 are arranged in and on, respectively, a sidewall of the processing vessel 1.

The upper section of the processing vessel 1 includes an opening, and the microwave introduction unit 30 can be disposed airtightly to fill in this opening. The microwave introduction unit 30 can be opened and closed via an opening/closing mechanism not shown.

The microwave introduction unit 30 includes, in order from bottom, a transmitting plate 28, a planar antenna member 31, and a slow-wave member (lagging member) 33. These elements are shrouded with a shielding member 34, a retaining ring 36, and an upper plate 29, and are fixed by a retaining ring 35. When the microwave introduction unit 30 is closed, sealing between an upper end of the processing vessel 1 and the upper plate 29 is provided by a sealing member 29a and as described later herein, the microwave introduction unit 30 is supported via the transmitting plate 28.

The transmitting plate 28 is formed of a dielectric material, for example, a ceramic material such as quartz, $Al_2O_3$, AlN, sapphire, or SiN, and functions as a microwave introduction window to let microwaves therethrough and introduce the microwaves into the processing vessel 1. For example, the transmitting plate 28 may have a recessed or grooved lower face to make the microwaves more uniform for greater plasma stability. The transmitting plate 28 is supported in an airtight condition via a sealing member 29b by an inner-surface protrusion 29c of the annular upper plate 29. The inside of the processing vessel 1 can therefore be maintained in an airtight condition when the microwave introduction unit 30 is in a closed condition.

The planar antenna member 31 has a disc shape and is fastened to an inner peripheral surface of the shielding member 34, at an upward position of the transmitting plate 28. The antenna member 31 has a surface formed of a gold- or silver-plated copper or aluminum sheet, for example. The antenna member 31 constitutes RLSA by having a large number of patterned through-slots (microwave-radiating holes) 32 for radiating microwaves or other electromagnetic waves.

Figure 2:
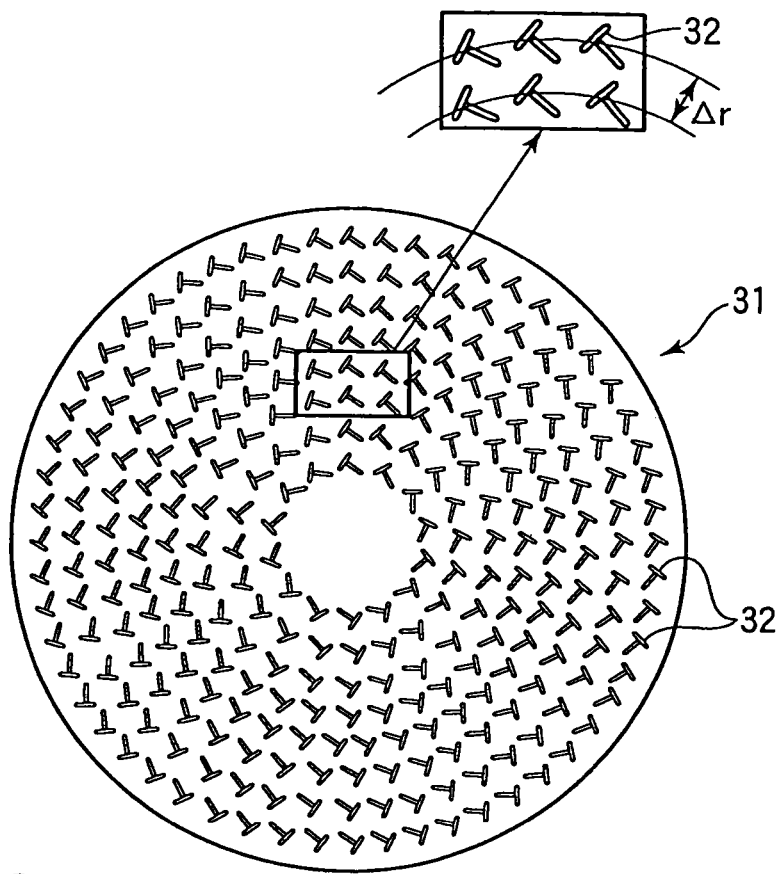
FIG. 2 is a plan view of a planar antenna member in the etching apparatus of FIG. 1.

Typically as shown in FIG. 2, every two adjacent linear slots 32 essentially orthogonal to each other form a T-shaped slot pair. These paired slots 32 are arranged concentrically. Length of each slot 32 and a spacing between the paired slots 32 are determined according to a particular wavelength ($\lambda g$) of the microwaves in the slow-wave member 33. For example, the paired slots 32 are disposed so that the spacing $\Delta r$ thereof is equal to $\lambda g$ or $\frac{1}{2}$ of $\lambda g$. Each slot 32 may have a circular, arc, or other shapes. In addition, the layout form of the paired slots 32 can be, for example, helical or radial, alternatively to the concentric form.

The slow-wave member 33 is constructed from a material having a dielectric constant greater than that obtainable in a vacuum. For example, this material is quartz, ceramic, fluorine-based resin such as polytetrafluoroethylene, or polyimidic resin. The slow-wave member 33 has a function that adjusts a plasma state by making the wavelength of the microwaves shorter than that achievable in a vacuum. The planar antenna member 31 and the transmitting plate 28 may be brought into firm contact with or spaced from each other. The same also applies to a relationship in position between the slow-wave member 33 and the planar antenna 31.

The shielding member 34 is formed with a cooling water channel 34a, through which cooling water is circulated to cool the shielding member 34, the slow-wave member 33, the planar antenna 31, and the transmitting plate 28. The shielding member 34 is grounded.

An opening 34b is formed centrally in the shielding member 34, and a waveguide 37 is connected to the opening 34b. A microwave generator 39 is connected to an end of the waveguide 37 via a matching circuit 38. Thus, microwaves that the microwave generator 39 has generated at a frequency of 2.45 GHz, for example, propagate to the planar antenna member 31 via the waveguide 37. Alternatively, the frequency of the microwaves can be, for example, 8.35 GHz or 1.98 GHz.

The waveguide 37 includes a coaxial waveguide 37a of a cross-sectionally circular shape, and a rectangular waveguide 37b. The coaxial waveguide 37a extends upward from the opening 34b in the shielding member 34. The rectangular waveguide 37b is connected to an upper end of the coaxial waveguide 37a via a mode changer 40, and extends in a horizontal direction. The mode changer 40 has a function by which the microwaves propagated in a TE (Transverse Electric) mode inside the rectangular waveguide 37b will be changed into microwaves of a TEM (Transverse Electromagnetic) mode. A lower end of an internal conductor 41 extending centrally in the coaxial waveguide 37a is connected to a central section of the planar antenna member 31. Thus, the microwaves are propagated to the planar antenna member 31 in radial form via the internal conductor 41 of the coaxial waveguide 37a efficiently and uniformly.

Figure 3:
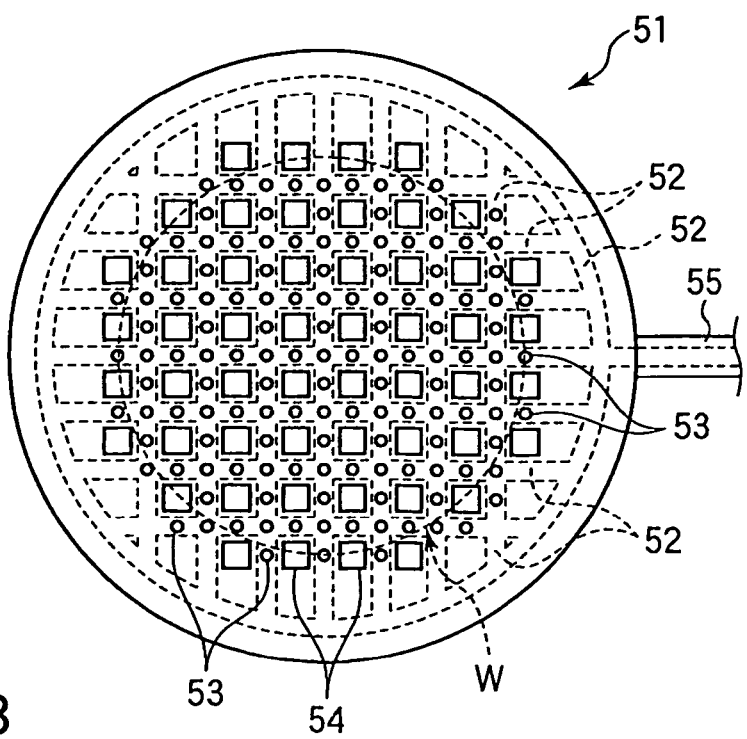
FIG. 3 is a plan view of a shower plate in the etching apparatus of FIG. 1.

A shower plate 51 for introducing a process gas for etching is provided horizontally between the susceptor 5 within the processing vessel 1 and the microwave introduction unit 30. As shown in FIG. 3, the shower plate 51 includes a grid-like formation of gas channels 52 and a large number of gas discharge holes 53 formed in the gas channels 52. The shower plate 51 also has a number of through-holes 54 each formed between any two gas channels 52.

A pipe 55 extending outward from the processing vessel 1 is connected to the gas channels 52 in the shower plate 51. The pipe 55 is branched into a $Cl_2$ gas pipe 56 connected to a $Cl_2$ gas source 59, an $O_2$ gas pipe 57 connected to an $O_2$ gas source 60, and an $N_2$ gas pipe 58 connected to an $N_2$ gas source 61. Each gas pipe 56, 57, 58 has a valve 62 and a mass flow controller 63. The $Cl_2$ gas, the $O_2$ gas, and the $N_2$ gas are introduced at a desired flow ratio from the gas sources 59, 60, 61 into the processing vessel 1 via the gas pipes 56, 57, 58, the pipe 55, and the shower plate 51. The plasma-etching apparatus 100 includes a gas supply system that supplies a main etching process gas ($Cl_2$ gas, $O_2$ gas) and a nitrogen-containing gas ($N_2$ gas) into the processing vessel 1 in this way while controlling respective flow rates.

A ring-shaped plasma gas introduction member 65 is provided along a wall of the processing vessel 1, above the shower plate 51. The gas introduction member 65 has a number of gas discharge holes along its inner surface. An argon (Ar) gas source 66 configured to supply an Ar gas as a plasma gas, is connected to the gas introduction member 65 via a pipe 67. A valve 68 and a mass flow controller 69 are connected to the pipe 67.

The Ar gas, after being introduced from the discharge holes in the gas introduction member 65 into the processing vessel 1, is activated to be changed into a plasma thereof by the microwaves introduced into the processing vessel 1 via the microwave introduction unit 30. This Ar plasma passes through the through-holes 54 in the shower plate 51, then excites the $Cl_2$ gas and $N_2$ gas discharged as the process gas constituent elements from the gas discharge holes 53 in the shower plate 51, and forms a plasma of the process gas. The plasma-etching apparatus 100 also includes a plasma generating system that generates a plasma in the processing vessel 1.

A monochromator 70 by which light from the plasma formed in the processing vessel 1 is dispersed into spectrum form is provided on a sidewall of the processing vessel 1. Also, a measuring unit (measuring instrument) 71 configured to measure the spectral light obtained by the monochromator 70 is connected thereto. The monochromator 70 and the measuring unit 71 constitute an emission spectrum detection system that detects emission spectra of the plasma of the process gas, generated in the processing vessel 1.

Various operating sections of the plasma-etching apparatus 100 are controlled by a process controller 77 including a computer. A user interface 78 including, for example, a keyboard for a process administrator to perform input operations and the like for controlling the etching apparatus 100, and a display unit for displaying an operational state of the apparatus, is connected to the process controller 77. The process controller 77 also has a connected storage unit 79 in which control programs, or recipes, each adapted to operate the etching apparatus 100 according to process parameters and execute the etching process, are stored. Alternatively, the recipes may be stored within a hard disk or a semiconductor memory or after storage of the recipes onto a portable storage medium such as a CD-ROM or DVD, this portable storage medium may be set in a required internal position of the storage unit 79. Further alternatively, each recipe may be transmitted from an external device via, for example, a special line, as appropriate. In accordance with an instruction or the like from the user interface 78, the process controller 77 calls up any necessary recipe from the storage unit 79 and executes the recipe.

An embodiment of an etching method implemented using the above-constructed etching apparatus 100 will be next described.

Figure 4:
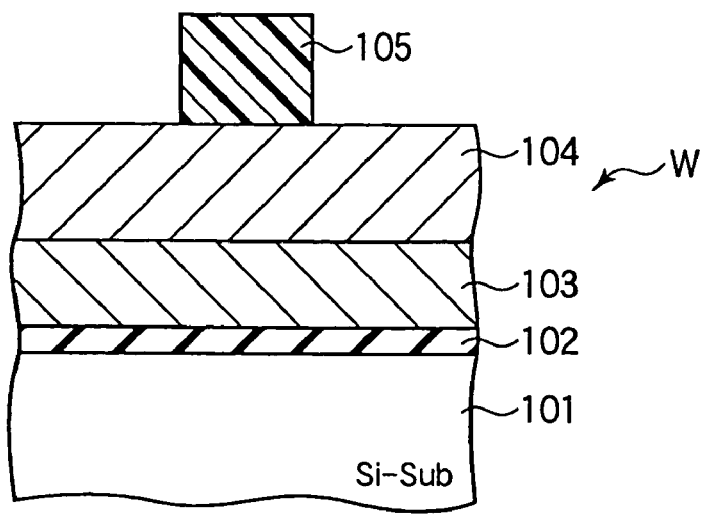
FIG. 4 is a partial cross-sectional view of a semiconductor wafer to which the plasma-etching method according to the first embodiment of the present invention is applied.

Such a semiconductor wafer W as illustrated in FIG. 4 is used as an object to be etched. This wafer W has a structure in which a gate oxide film 102, a polysilicon film 103, and a tungsten-containing film 104 are formed sequentially over a silicon substrate 101 and a patterned etching mask 105 is further formed on the tungsten-containing film 104. The tungsten-containing film 104 may be a single-layered tungsten film or a stacked film formation with a tungsten film on a tungsten nitride (WN) film. Further alternatively, the tungsten-containing film 104 may be a stack formed of any other combination including, for example, a tungsten film, a tungsten silicide (WSi) film, etc.

First, the wafer W is loaded into the processing vessel 1 and then rested on the susceptor 5. Next, the Ar gas is introduced from the Ar gas source 66 into the processing vessel 1 and at the same time, the microwaves that the microwave generator 39 has generated are introduced into the processing vessel 1. The microwaves that the microwave generator 39 has generated are propagated in the TE mode inside the rectangular waveguide 37. These microwaves of the TE mode are changed into microwaves of the TEM mode by the mode changer 40, and the microwaves of the TEM mode travel through the coaxial waveguide 37a and are propagated towards the planar antenna member 31. These microwaves are then radiated therefrom, and are introduced into the processing vessel 1 through the transmitting plate 28. Electromagnetic fields are thus formed in the processing vessel 1 by the microwaves, and the Ar gas that is a plasma-creating gas is converted into a plasma form. Power supplied from the DC power supply 8 to the electrode 7 at this time makes the electrostatic chuck 6 chuck the semiconductor wafer W via the plasma electrostatically.

Next, the $Cl_2$ gas, $O_2$ gas, and $N_2$ gas supplied from the gas sources 59, 60, 61, respectively, are discharged from the shower plate 51 into the processing vessel 1. The $Cl_2$ gas, the $O_2$ gas, and the $N_2$ gas are supplied at the desired flow ratio under control of the respective mass flow controllers 63.

Figure 5:
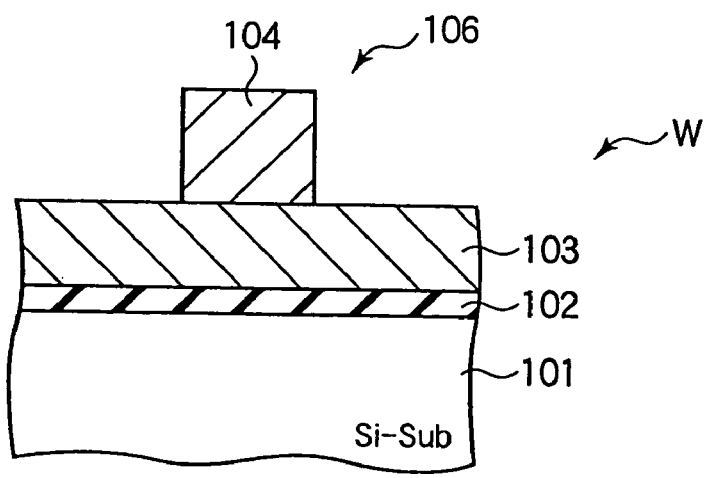
FIG. 5 is a diagram showing a gate electrode formed on the semiconductor wafer of FIG. 4 by etching.

The $Cl_2$ gas, $O_2$ gas, and $N_2$ gas that have been discharged as the process gas constituent elements into the processing vessel 1 are excited by the Ar plasma flowing in through the through-holes 54 in the shower plate 51, and are thus converted into a plasma. The tungsten-containing film 104 is etched using the plasma of the process gas, and as shown in FIG. 5, a gate electrode 106 formed of a tungsten-containing film is formed.

The plasma formed at this time becomes a plasma with a high density essentially of $1 \times 10^{10}$-$5 \times 10^{12}/cm^3$, and with a low electron temperature essentially of 1.5 eV or less near the wafer W, timely with the radiation of microwaves from the large number of slots 32 in the planar antenna member 31.

During this etching process, high-frequency power is supplied from the high-frequency power supply 20 to the susceptor 5, thus drawing in ions toward the semiconductor wafer W. This enhances anisotropy of etching and improves morphology/geometry. An internal pressure of the processing vessel during etching preferably ranges from 0.65 to 2.6 Pa, and a preferable temperature of the wafer ranges from 50 to 70° C.

Figure 6:
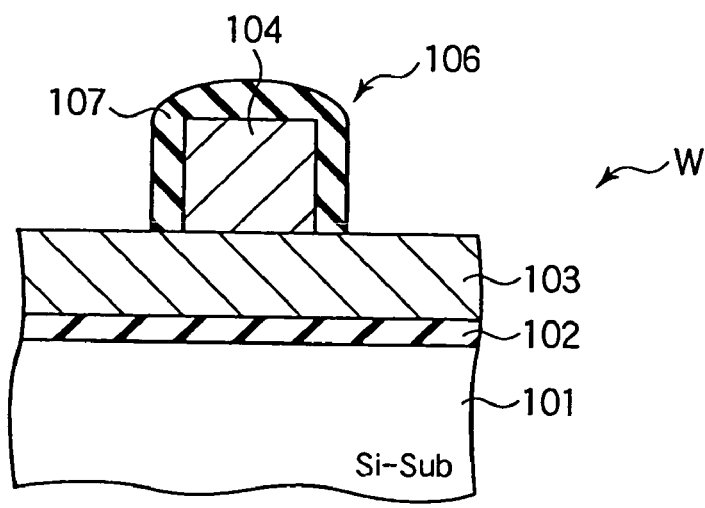
FIG. 6 is a diagram showing a reaction product deposited on the gate electrode formed on the semiconductor wafer of FIG. 4.

Conventional etching of a tungsten-containing film using only a $Cl_2$ gas and an $O_2$ gas as the etching gases, poses the following problems. That is to say, such conventional etching causes inconvenience in that as shown in FIG. 6, a reaction product 107 of relatively low volatility, such as $WO_3$ or $WCl_xO_y$, is deposited outside the gate electrode 106 formed by etching. The deposition increases with an increase in the flow rate of the $O_2$ gas added for enhanced etching selectivity. Increasing the flow rate of the $O_2$ gas in an attempt to enhance an etching selectivity will therefore deteriorate the morphology/geometry of the film surface etched.

Conversely, reducing the flow rate of the $O_2$ gas to avoid the above will reduce etching selectivity. To improve the etching morphology/geometry while at the same time increasing the flow rate of the $O_2$ gas to a level high enough to improve the selectivity, high-temperature processing becomes necessary, which is also inconvenient.

In order to avoid the above inconveniences, the present embodiment uses an $N_2$ gas added as an etching process gas to the $Cl_2$ and $O_2$ gases that are constituent elements of the main etching gas. The use of these gases allows the deposition of the above-mentioned reaction products to be suppressed and hence the morphology/geometry and selectivity of etching to be improved. Mere introduction of an $N_2$ gas alone, however, may not yield a sufficient effect.

For this reason, the present inventors conducted further studies to find that nitrogen ions are important for the morphology/geometry and selectivity of etching. The present inventors also measured emission spectra of a plasma to discover that only $N_2^+$ of all nitrogen ions can be detected and that if plasma etching is conducted so that an $N_2^+/N_2$ intensity ratio of $N_2^+$ to $N_2$, derived from the emission spectra of the plasma, is at least 0.6, the morphology/geometry and selectivity of etching can be sufficiently improved without high-temperature processing. In the present embodiment, therefore, etching is conducted under a condition that the above-mentioned $N_2^+/N_2$ ratio derived from the emission spectra of the plasma is at least 0.6.

Additionally, in this case, electric power supplied from the microwave generator 39 preferably ranges from 2000 to 3000 W, and the flow ratio $N_2/Cl_2$ (the ratio of the $N_2$ gas flow rate to the $Cl_2$ gas flow rate) is preferably from 200% to 400%. Furthermore, the flow ratio $O_2/Cl_2$ (the ratio of the $O_2$ gas flow rate to the $Cl_2$ gas flow rate) is preferably from 10% to 200%.

Since the plasma includes an abundance of nitrogen ions as discussed above, nitriding/reducing actions of the nitrogen ions are effectively developed. This suppresses oxidation of the reaction product, or even if an oxide of low volatility, such as $WO_3$, is formed, this oxide will be easily reduced by the following formula:

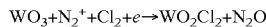

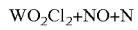

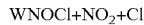

(etc.)

Accordingly, appropriate etching morphology/geometry excellent in vertical profile, and a high selectivity to an under-layer can be achieved at the same time, even at low temperatures of about 60° C.

The $N_2^+/N_2$ ratio of the intensity of $N_2^+$ to that of $N_2$ in the plasma can be changed by varying process parameters such as the composition of the process gas and the supply power energy of the microwave generator, and the desired $N_2^+/N_2$ value can be obtained by controlling these parameters appropriately.

The emission spectra of the plasma can be calculated by dispersing the plasma light into spectral form with the monochromator 70 and then measuring the thus-obtained spectral light using the measuring unit 71 connected to the monochromator 70. The process parameters are therefore controlled on the basis of the calculated emission spectra of the plasma so that the $N_2^+/N_2$ ratio thereof becomes at least 0.6. Typically, a range of the process parameters under which the emission spectra of the plasma take an $N_2^+/N_2$ value of 0.6 or more is examined in advance. After this, plasma etching is conducted while the etching apparatus 100 (especially, the gas supply system and the plasma generating system) is being controlled via the process controller 77 for the process parameters to fall or stay within the examined range.

To form a plasma whose $N_2^+/N_2$ ratio of the intensity of $N_2^+$ to that of $N_2$ is at least 0.6, it is preferable that such an RLSA-based microwave plasma source as employed in the present embodiment should be used. Although ICP (Inductively Coupled Plasma) sources are widely known as another kind of high-density plasma generator, it is not too appropriate to use ICP, because an $N_2^+/N_2$ intensity ratio of 0.6 or more is difficult to obtain therefrom. This is described below.

Figure 7:
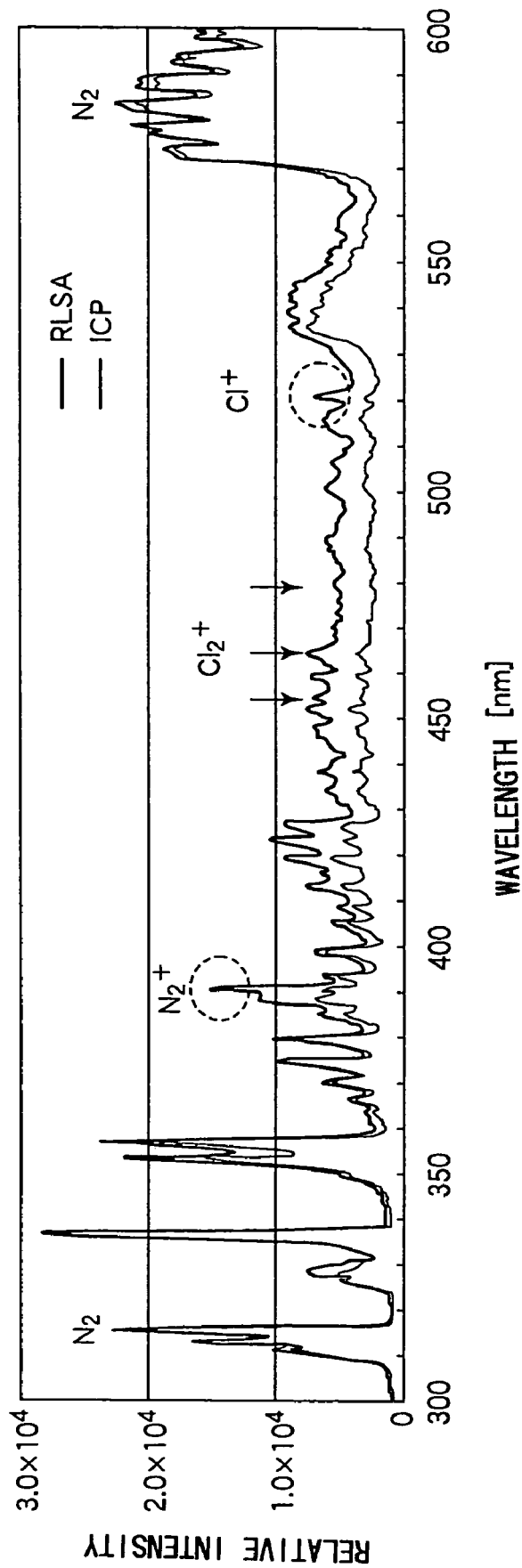
FIG. 7 is a graph that shows emission spectra of a plasma in an RLSA plasma-etching apparatus and an ICP etching apparatus.

Emission spectra of a plasma in an RLSA plasma-etching apparatus, and that of an ICP etching apparatus are first compared. The RLSA plasma-etching apparatus in this case includes a 2.45-GHz microwave power supply 39 and a 400-kHz high-frequency bias power supply 19. The ICP etching apparatus includes a 13.56-MHz high-frequency power supply. FIG. 7 shows the emission spectra of the plasmas obtained when both the power of the microwave power supply in the RLSA plasma-etching apparatus and plasma-forming power of the ICP etching apparatus are 2000 W. The composition of the process gas at this time is $Cl_2:N_2:O_2=2:8:1$, and the internal pressure of the processing vessel is 1.3 Pa. As is obvious from FIG. 7, a peak of $N_2^+$ is definitely higher in the RLSA plasma-etching apparatus.

Figure 8:
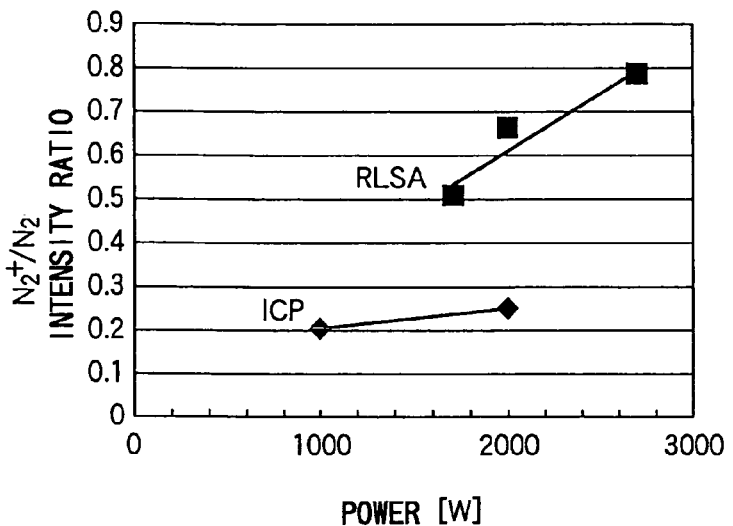
FIG. 8 is a graph that shows a relationship between an electric power level and $N_2^+/N_2$ intensity ratio in the RLSA plasma-etching apparatus, and a relationship between an electric power level and $N_2^+/N_2$ intensity ratio in the ICP etching apparatus.

Next, the power of the microwave power supply in the RLSA plasma-etching apparatus and the power of the ICP etching apparatus are varied and a relationship between the power and $N_2^+/N_2$ (intensity ratio) is analyzed. Analytical results are shown in FIG. 8. As shown in FIG. 8, it can be seen that in a normal operating range, $N_2^+/N_2$ is clearly higher in the RLSA plasma-etching apparatus, irrespective of the power level. This means that the process gas is easier to ionize in the RLSA plasma-etching apparatus. It can also be seen that in the normal operating range, whereas $N_2^+/N_2$ is over 0.6 in the RLSA plasma, $N_2^+/N_2$ is less than 0.3 in the ICP etching apparatus.

Figure 9:
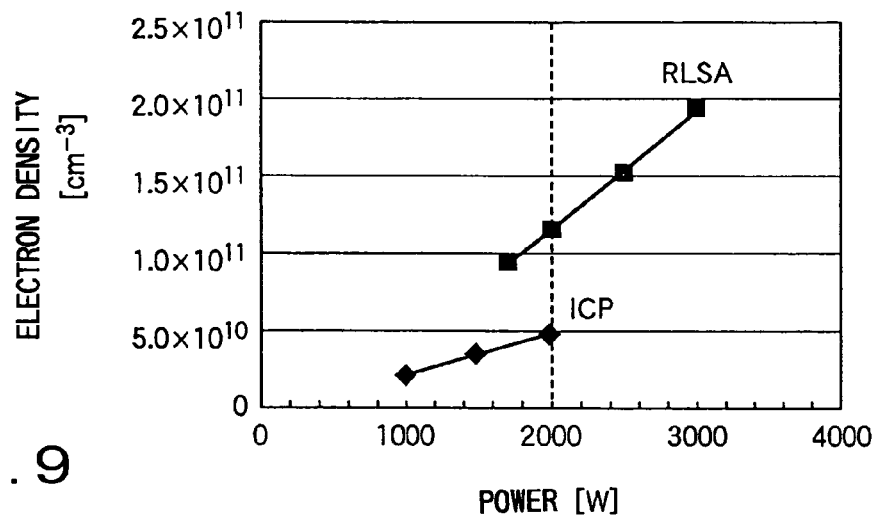
FIG. 9 is a graph that shows a relationship between a plasma-forming electric power level and electron density in the RLSA plasma-etching apparatus, and a relationship between a plasma-forming electric power level and electron density in the ICP etching apparatus.
Figure 10:
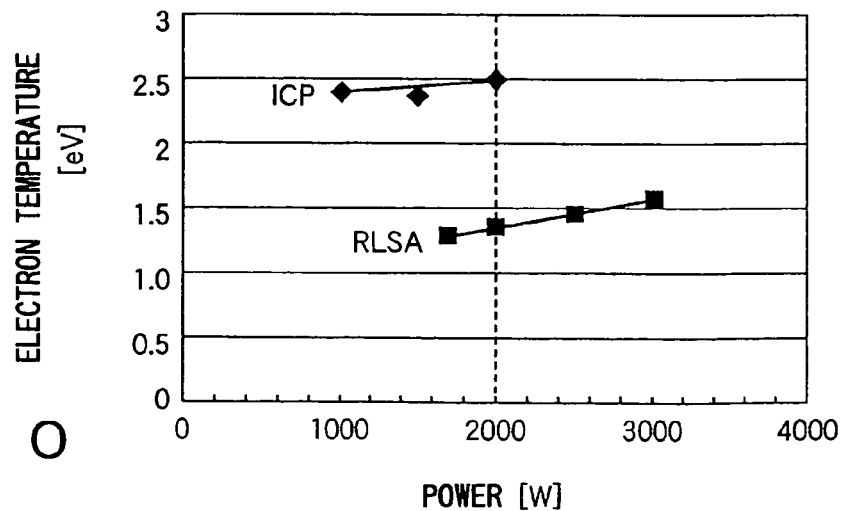
FIG. 10 is a graph that shows a relationship between a plasma-forming electric power level and electron temperature in the RLSA plasma-etching apparatus, and a relationship between a plasma-forming electric power level and electron temperature in the ICP etching apparatus.

FIG. 9 shows a relationship between the plasma-forming power level and electron density in the RLSA plasma-etching apparatus, and a relationship between the plasma-forming power level and electron density in the ICP etching apparatus. FIG. 10 shows a relationship between the plasma-forming power level and electron temperature in the RLSA plasma-etching apparatus, and a relationship between the plasma-forming power level and electron temperature in the ICP etching apparatus. These figures clearly indicate that the RLSA plasma, compared with ICP, is high in electron density and low in electron temperature. For these reasons, the process gas is considered to be easier to ionize in the RLSA plasma-etching apparatus. FIGS. 9, 10 assume that an $N_2$ gas is used as the process gas, and that the internal pressure of the processing vessel is 1.3 Pa.

Experimental results that became a basis for defining the $N_2^+/N_2$ intensity ratio range as 0.6 or more, are next described. The experiments assume that the RLSA plasma-etching apparatus of the structure shown in FIG. 1 is used and that a $Cl_2$ gas, an $O_2$ gas, and an $N_2$ gas are used as the process gas constituent elements. Also, a processing vessel internal pressure of 1.3 Pa and a susceptor temperature of 60° C. are assumed. A tungsten film on a semiconductor wafer of the structure shown in FIG. 4 is etched at various gas composition ratios and microwave generator power levels. An etching selectivity of the tungsten film with respect to a polysilicon film forming an under-layer, and an influence of deposition upon the etched-surface morphology/geometry are examined after the etching of the tungsten film.

Figure 11:
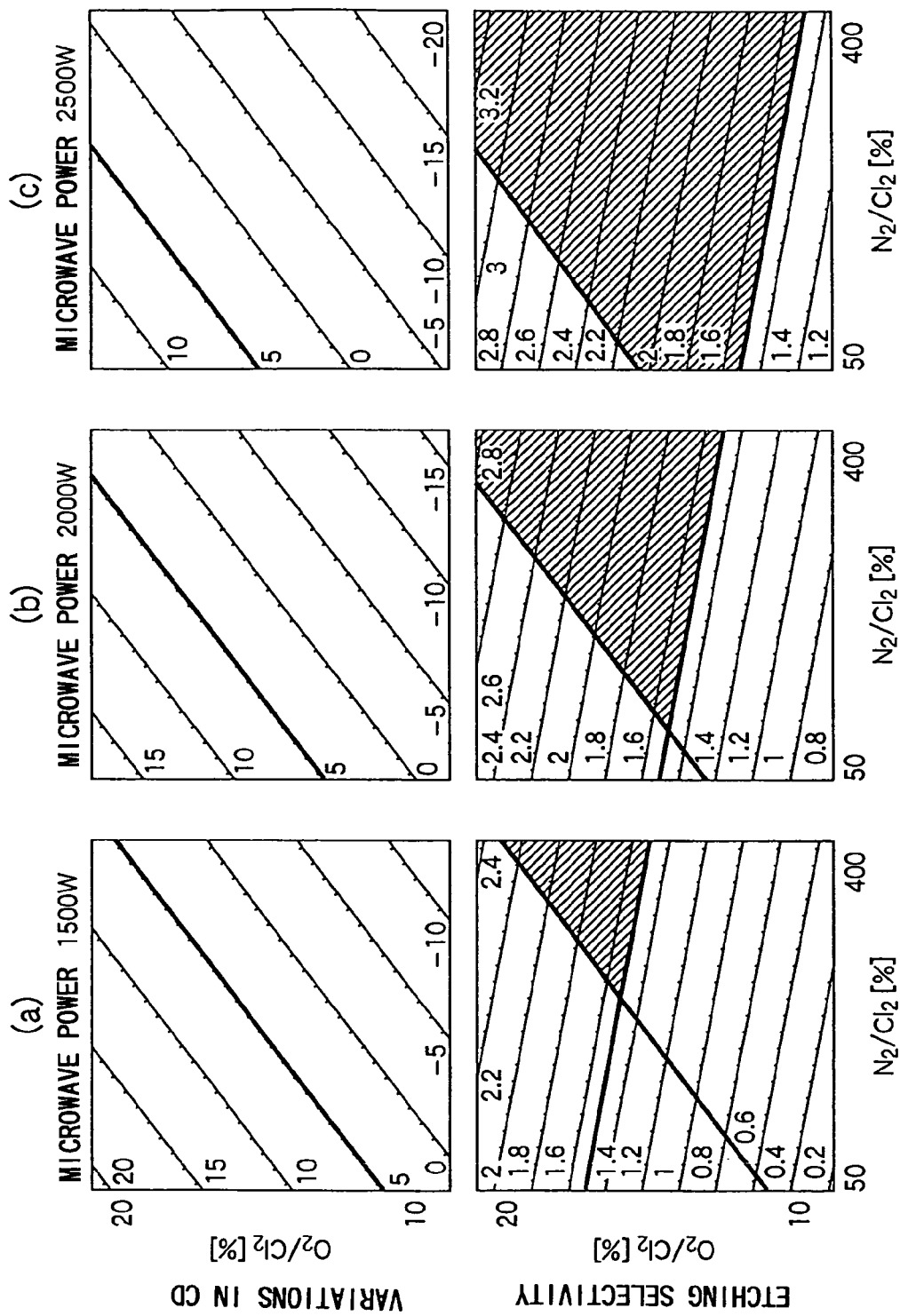
FIG. 11 shows graphs each showing a relationship between $N_2/Cl_2$ and $O_2/Cl_2$, and an etched-surface morphology/geometry (variations in CD) and an etching selectivity, these relationships relating to the RLSA plasma-etching apparatus.

FIG. 11 shows a relationship between the etched-surface morphology/geometry (variations in critical dimension CD) and etching selectivity in the RLSA plasma-etching apparatus, the relationship being plotted for $N_2/Cl_2$ on a horizontal axis and $O_2/Cl_2$ on a vertical axis. Data at three different power levels of the microwave generator 39, namely, (a) 1500 W, (b) 2000 W, and (c) 2500 W, are shown in FIG. 11. In each of the three cases, an upper graph represents the variations in CD, that is, changes in deposition thickness (nm) of the reaction product 107 in FIG. 6, and a lower graph represents the selectivity. A region in which the variations in CD due to deposition are less than 5 nm and the selectivity is 1.5 or more is indicated by shading in the lower graph.

Figure 12:
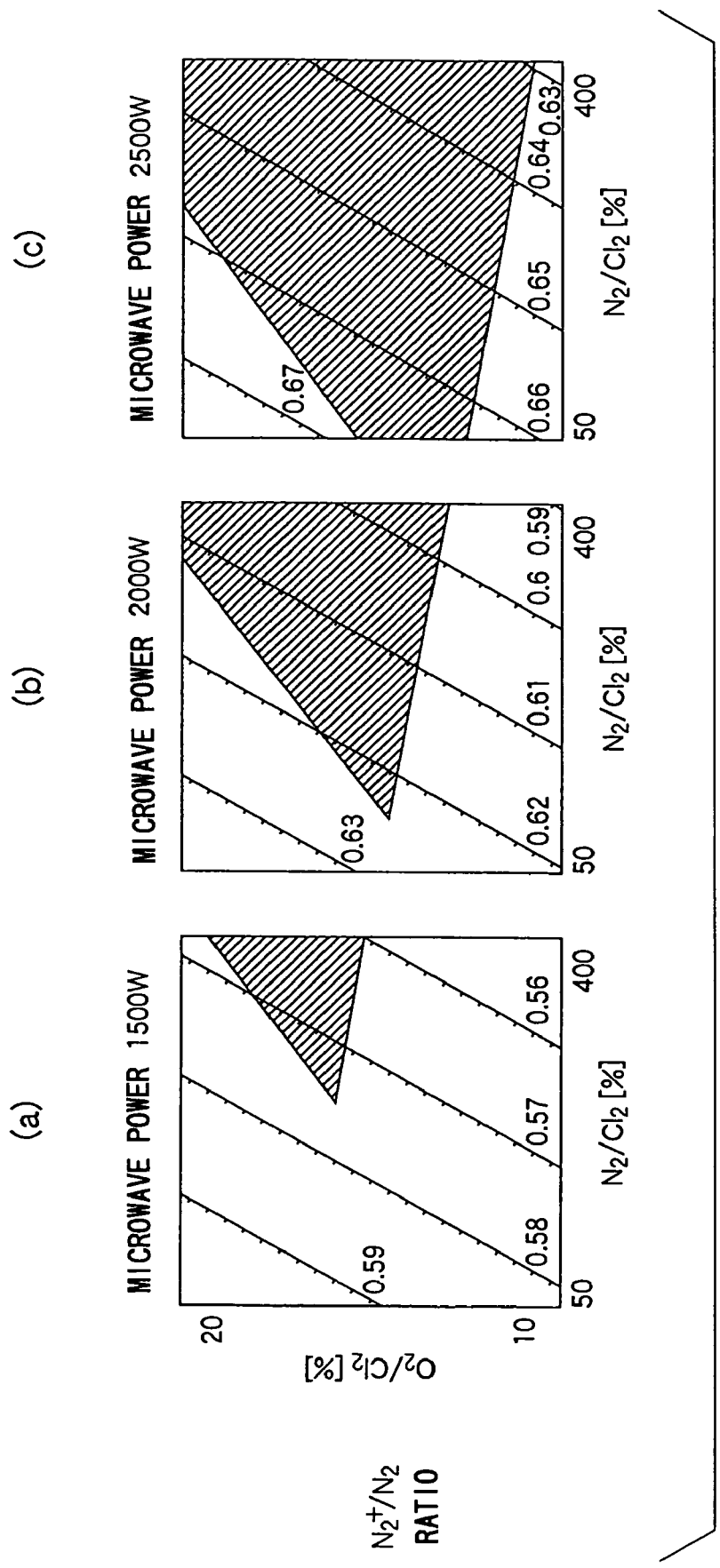
FIG. 12 shows graphs each showing a relationship between $N_2/Cl_2$ and $O_2/Cl_2$, and an $N_2^+/N_2$ intensity ratio obtained from emission spectra of a plasma, in the RLSA plasma-etching apparatus.

FIG. 12 shows a relationship between the emission spectra of the plasma and the $N_2^+/N_2$ intensity ratio obtained from the spectra, the relationship also being plotted for $N_2/Cl_2$ on a horizontal axis and $O_2/Cl_2$ on a vertical axis. Data at three different power levels of the microwave generator 39, namely, (a) 1500 W, (b) 2000 W, and (c) 2500 W, are shown in FIG. 12. The USB2000 Miniature Fiber Optics Spectrometer manufactured by Ocean Optics, Inc., was used as the monochromator 70. The region in FIG. 11 where the variations in CD due to deposition are less than 5 nm and the selectivity is 1.5 or more is also indicated by shading in FIG. 12.

The $N_2/Cl_2$ value is 200% that works in the worst favorable form upon characteristics of both the CD variations and selectivity within a preferable range of 200%-400%. Since the $O_2/Cl_2$ value is in a relationship of trade-off for both characteristics, 15% that is a median value in a preferable range of 10%-20% is assigned to $O_2/Cl_2$. The relationship shown in FIG. 13 is derived from the results shown in FIGS. 11 and 12.

Figure 13:
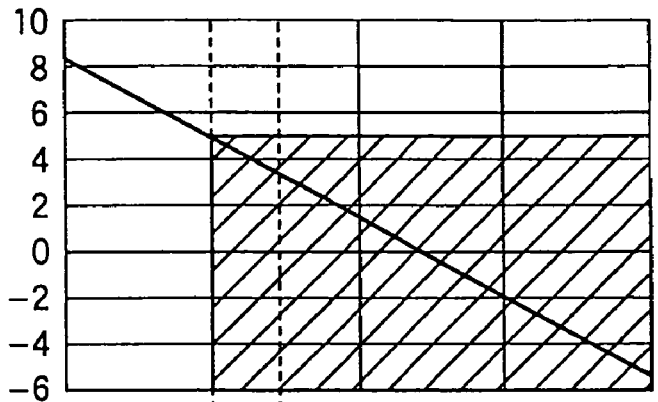
FIG. 13 shows graphs showing relationships between a microwave electric power level, and the CD variations (a), etching selectivity (b), and $N_2^+/N_2$ ratio (c), respectively, these relationships being derived from FIGS. 11 and 12.
Figure 13:
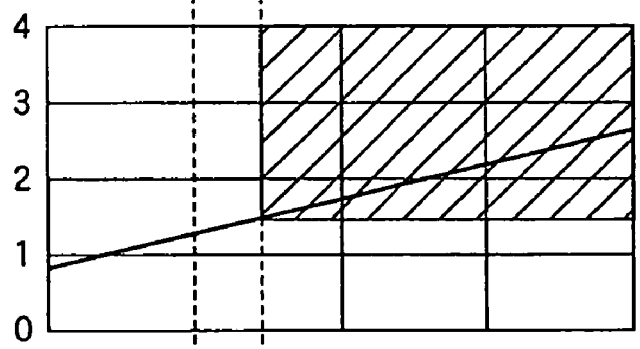
Figure 13:
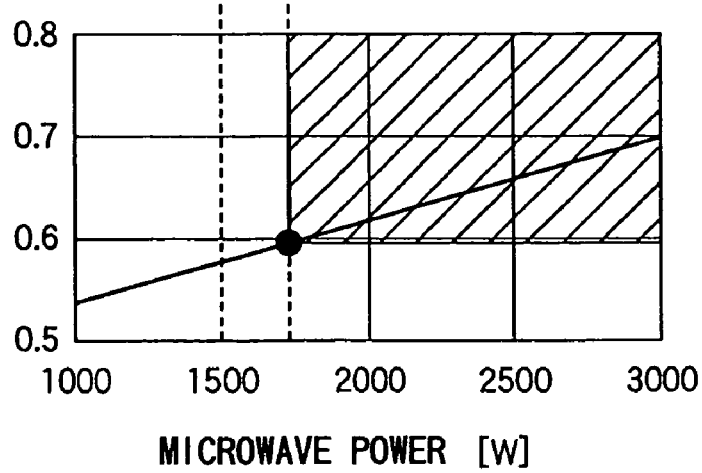

In FIG. 13, the power level of the microwave power supply 39 is plotted on a horizontal axis, and the CD variations (a), the etching selectivity (b), and the $N_2^+/N_2$ ratio (c) are plotted on a vertical axis. If the selectivity here is less than 1.5, this will cause an unfavorable condition since the polysilicon film 103 that is the under-layer in FIG. 4 will have a rough surface. In FIG. 6, line width of the tungsten-containing film 104 is 100 nm, and the CD variations of up to 5% (i.e., up to 5 nm) lead to no problems associated with practical use.

It can be seen from FIGS. 13(a) and (b) that the region where the etching selectivity and the morphology/geometry are appropriate, that is, where the selectivity is 1.5 or more and the CD variations are 5% or less, is a region in which the microwave power is 1700 W or more. It can be seen from FIG. 13(c) that the region is a region in which $N_2^+/N_2$ ratios is at least 0.6. That is to say, it was confirmed that the appropriate selectivity and morphology/geometry of etching can be achieved at the same time at $N_2^+/N_2$ ratios of 0.6 and more.

The present invention can be modified in various forms without being limited to the above embodiment. For instance, while an example in which a tungsten-containing film is used as the film to be etched has been described in the above embodiment, the present invention is not limited to/by the example. In addition, as described above, the tungsten-containing film may be replaced by either a film formed only of tungsten, a film formed of a compound of tungsten, or a stacked structure of these last two materials.

Furthermore, although a $Cl_2$ gas has been used as the chlorine-containing gas during the etching of the tungsten-containing film formed on polysilicon, the kind of chlorine-containing gas used is not limited to the $Cl_2$ gas and may be replaced by others such as a $BCl_3$ gas.

Furthermore, the kind of oxygen-containing gas used is not limited to the $O_2$ gas, and the kind of nitrogen-containing gas used is not limited to the $N_2$ gas, either.

Besides, an oxynitride gas that contains oxygen and nitrogen at the same time may be used instead of using the oxygen-containing gas and the nitrogen-containing gas separately. Such an oxynitride gas can be an NO gas, an $N_2O$ gas, an $NO_2$ gas, or the like.

The scope of application of the present invention is not limited to the above embodiment and the invention is also applicable to other materials likely to make the oxidation of a reaction product suppressible by the nitriding/reducing actions of nitrogen ions and to provide the appropriate etching morphology/geometry and a high selectivity with respect to the under-layer simultaneously, even at low temperature. In such cases, for example, a film that contains tantalum or titanium can be used instead of the tungsten-containing film.

Additionally, although the RLSA-based microwave plasma source has been described as an example of a plasma source, the antenna used may be a planar antenna other than RLSA or may be of a microwave plasma type not using a planar antenna. Furthermore, provided that an $N_2^+/N_2$ ratio of at least 0.6 can be achieved, a plasma source other than those which use microwaves may be applicable. However, using the RLSA plasma type is preferable since this type makes it relatively easy to achieve the $N_2^+/N_2$ ratio of 0.6 or more.

Moreover, although the semiconductor wafer has been described in the above embodiment as an example of a substrate constituting the object to undergo processing, the scope of the present invention is not limited to the wafer type of substrate and the invention is also applicable to other types of substrates, such as a glass substrate for flat-panel displays (FPDs) represented by a liquid-crystal display (LCD) device.

The invention claimed is:

1. An etching method comprising the steps of:
   providing an object including a substrate, an underlying film made of a silicon-containing film formed on the substrate, and a film to be etched that is made of a tungsten-containing film formed on the underlying film; and
   using a plasma of a process gas to carry out an etching process for the object, wherein:
   a chlorine-containing gas, an oxygen-containing gas, and a nitrogen-containing gas are used as the process gas to etch the tungsten-containing film under a condition that an $N_2^+/N_2$ intensity ratio of $N_2^+$ to $N_2$, derived from emission spectra of the Plasma, is at least 0.6,
   the chlorine-containing gas is a $Cl_2$ gas, the oxygen-containing gas is an $O_2$ gas, and the nitrogen-containing gas is an $N_2$ gas, and
   the silicon-containing film is a polysilicon film, and the tungsten-containing film is a tungsten film of a stacked structure of a tungsten nitride film and a tungsten film.

2. The etching method according to claim 1, wherein:
   the plasma is generated by using microwaves.

3. The etching method according to claim 2, wherein:
   the plasma is generated by using the microwaves radiated from a planar antenna.

4. The etching method according to claim 3, wherein:
   the planar antenna is a radial line slot antenna.

5. The etching method according to claim 1, wherein:
   the process gas supplied into a processing vessel is activated to be changed into a plasma by using microwaves radiated from a radial line slot antenna at an electric power of at least 2000 W; and
   a ratio of a flow rate of the $N_2$ gas to a flow rate of the $Cl_2$ gas is at least 200% in the process gas supplied into the processing vessel.

* * * * *